(12) United States Patent
Yan et al.

(10) Patent No.: US 9,231,752 B1
(45) Date of Patent: Jan. 5, 2016

(54) CLOCK DATA RECOVERY WITH INCREASED FREQUENCY OFFSET TRACKING

(71) Applicant: ORACLE INTERNATIONAL CORPORATION, Redwood City, CA (US)

(72) Inventors: Yan Yan, San Jose, CA (US); Ali Gokhan Ileri, Santa Clara, CA (US); Jianghui Su, San Jose, CA (US); Dawei Huang, San Diego, CA (US); Xun Zhang, Westford, MA (US); Sifang You, San Diego, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 0 days.

(21) Appl. No.: 14/639,886

(22) Filed: Mar. 5, 2015

(51) Int. Cl.
*H04L 7/00* (2006.01)
*H04L 7/06* (2006.01)

(52) U.S. Cl.
CPC ............ *H04L 7/0016* (2013.01); *H04L 7/0079* (2013.01); *H04L 7/06* (2013.01)

(58) Field of Classification Search
CPC ........ H04L 7/0016; H04L 7/0079; H04L 7/06

USPC ......................................................... 316/357
See application file for complete search history.

(56) References Cited

U.S. PATENT DOCUMENTS

| | | | | |
|---|---|---|---|---|
| 5,805,632 | A * | 9/1998 | Leger ............................. | 375/282 |
| 8,239,579 | B2 * | 8/2012 | Tang et al. .................... | 709/248 |
| 8,923,371 | B2 * | 12/2014 | Sindalovsky et al. ......... | 375/222 |
| 2005/0078780 | A1 * | 4/2005 | Chou et al. .................... | 375/350 |
| 2012/0170621 | A1 * | 7/2012 | Tracy et al. ................... | 375/219 |

* cited by examiner

*Primary Examiner* — Juan A Torres
(74) *Attorney, Agent, or Firm* — Marsh Fischmann & Breyfogle LLP; Daniel J. Sherwinter (57) ABSTRACT

Embodiments include systems and methods for increasing frequency offset tracking in clock data recovery (CDR) systems. For example, in asynchronous clocking environments, the receiver-side clock frequency can be offset from the transmitter-side clock. While traditional CDR systems can handle some amount of offset, they are typically ineffective at accurately adapting the receiver-side clocking to an optimal data sampling rate when the offset is excessive. Embodiments include a CDR frequency offset adaptation loop that generates an adaptation signal, which can be monitored to detect an adaptation error arising from excessive frequency offset. In response to the detecting, an offset seed can be selected and injected into the frequency offset adaptation loop, thereby reinitializing the frequency offset adaptation loop with a less stressful seed.

20 Claims, 4 Drawing Sheets

CLOCK DATA RECOVERY WITH INCREASED FREQUENCY OFFSET TRACKING

FIELD

Embodiments relate generally to clock data recovery circuits, and, more particularly, to techniques for clock data recovery with increased frequency offset tracking.

BACKGROUND

In many electronics applications, a data is carried from a transmitter to a receiver over a bus or other type of channel. For example, a serializer/deserializer (SERDES) circuit can compress a relatively wide, parallel input into a relatively narrow, serial signal (e.g., a single "bit," differential signal) for communication over a serial bus. The serial bus switches at an appreciably higher rate than the parallel bus, and serial communication of the data stream tends to reduce cost, complexity, power, and board real estate relative to comparable parallel communications. As bus speeds increase, parallel communications manifest even higher power consumption and more issues relating to timing (e.g., skew mismatches and bit misalignment), making SERDES circuits even more attractive.

Signals sent over the channel can be sampled at the receiver to recover the transmitted data. Often, even if the data speed is known and appropriate clock frequencies are set at the transmitter and receiver sides, the transmitter and receiver can use separate clock circuits (i.e., there is asynchronous clocking). Because each clock frequency can deviate from its nominal center frequency (e.g., due to differences between crystal oscillators, manufacturing variances, etc.), there can be an offset between the transmit and receive clock frequencies. If not corrected at the receiver, the frequency offset can cause sampling timing errors, which can result in data recovery errors.

A clock data recovery (CDR) circuit can be used to recover an appropriate clocking signal from the data itself. For example, a CDR can often optimize sample clock timing, even in the presence of some amount of clock jitter, noisy data, small signal levels, and/or other difficult conditions. However, in some instances, the clock recovery conditions can frustrate CDR operations. For example, when the frequency offset between the transmitter-side and receiver-side clocks is too large, the CDR may be unable to properly adjust the receiver-side clock to compensate for that offset.

BRIEF SUMMARY

Among other things, embodiments provide novel systems and methods for increasing frequency offset tracking in clock data recovery (CDR) systems. For example, in asynchronous clocking environments (i.e., where a transmitter and receiver on either side of a data channel have separate clock circuits), the receiver-side clock frequency can be offset from the transmitter-side clock. While traditional CDR systems can handle some amount of offset, they are typically ineffective at accurately adapting the receiver-side clocking to an optimal data sampling rate when the offset is excessive. Embodiments include a CDR frequency offset adaptation loop that generates an adaptation signal, which can be monitored to detect an adaptation error arising from excessive frequency offset. In response to the detecting, an offset seed can be selected and injected into the frequency offset adaptation loop, thereby reinitializing the frequency offset adaptation loop with a less stressful seed (i.e., a seed that can help the frequency offset adaptation succeed by reducing the effective frequency offset left to track).

According to one set of embodiments, a system is provided for clock data recovery. The system includes: a clock data recovery (CDR) circuit that operates to calculate a frequency offset as a function of a received data signal and an input timing signal, and to generate an adaptation signal according to the frequency offset; an adaptation monitor circuit that operates to monitor the adaptation signal to detect an adaptation failure; and an adaptation recovery circuit that operates to inject an offset seed into the CDR circuit in response to the adaptation monitor circuit detecting the adaptation failure.

According to another set of embodiments, a method is provided for clock data recovery. The method includes: calculating a frequency offset in a clock-data recovery (CDR) frequency offset adaptation loop as a function of a received data signal and an input timing signal; generating an adaptation signal according to the frequency offset; monitoring the adaptation signal to detect an adaptation failure; selecting one of a predetermined set of offset seeds; and injecting the selected offset seed into the frequency offset adaptation loop in response to the adaptation monitor circuit detecting the adaptation failure.

According to another set of embodiments, a receiver system is provided in asynchronous communication with a transmitter system over a data channel. The receiver system includes: a first-order clock data recovery (CDR) subsystem that generates a first adaptation signal as a function of a data signal received over the data channel and an input timing signal; and a second-order CDR system that generates a second adaptation signal as a function of the first adaptation signal by calculating a frequency offset according to a pattern detected in the first adaptation signal, the calculated frequency offset corresponding to an offset between a frequency of a transmit clocking signal generated at the transmitter system and a frequency of the local clocking signal. The second-order CDR system includes a frequency offset adaptation loop that: monitors the second adaptation signal to detect an adaptation failure resulting from the frequency offset being outside an adaptable range of the second-order CDR system; and injects an offset seed into the frequency offset adaptation loop in response to detecting the adaptation failure.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Many electronics applications include communications channels that have transmitter and receiver components to move data through the electronics application. Some receiver circuits are serializer/deserializer (SERDES) receiver circuits that can, for example, convert parallel data from the communications channel into a serial data stream for processing, etc. Various functions of the SERDES rely on clocking to effectively sample and/or process the data being received from the channel, and the clock signal is often recovered from the data itself using a clock data recovery (CDR) circuit. One type of CDR circuit (sometimes referred to as a "bang-bang CDR" or an "oversampling CDR") attempts to extract clock timing information from both data and edge samples. Thus, the rate of the resulting clock signal is double the data rate. Another type of CDR circuit (sometimes referred to as a "Muller-Mueller CDR" or "MM CDR") uses data and error samples, but not edge samples, to recover clock timing information. Thus, the rate of the resulting clock signal is the data rate, and such CDR techniques are often referred to as "at-rate" CDR. At-rate CDR techniques provide various features. For example, avoiding double-rate clocking can appreciably reduce power consumption.

It is generally desirable for the receiver circuit to clock received data in the center of the "data eye," which can improve data recovery, reduce error, increase link margin, etc. Finding the optimal clocking location is typically a dynamic process that involves the CDR circuit and equalization circuitry (e.g., a decision feedback equalizer, linear equalizer, feed-forward equalizer, etc.). Typical at-rate CDR techniques extract timing information by analyzing a channel pulse response at one or more sample locations and determining whether current clocking appears to be early or late with respect to the pulse response. The clocking signal can then be shifted, as appropriate. However, a number of factors, such as inter-channel interference and clock jitter, can tend to frustrate accurate clock data recovery from the channel pulse response.

One factor that can frustrate clock data recovery is frequency offset between the transmitter-side and receiver-side clocks in an asynchronous clocking environment. In practice, while a clock generation circuit (e.g., crystal oscillator) can be specified with a nominal center frequency, its actual operating frequency is typically offset from that center frequency by some amount. The offset is often represent in parts per million ("PPM"), and will tend to be very small in higher quality clock generation circuits. For example, a clock may be designed with a center frequency of one Gigahertz and a maximum offset of ±250 PPM. In some systems, the transmitter and receiver are close together or otherwise implemented to use a same clock generation circuit, so that the circuits have synchronous clocking. In such systems, any clock frequency offset will be equally experienced by both the transmitter and receiver systems. In other systems, the receiver and transmitter systems each use their own local clock (e.g., their own clock generation circuit), so that their clocking is asynchronous. Thus, even if both the receiver-side and transmitter-side clocks are designed to have the same center frequency, each may have a different frequency offset, which may manifest in a frequency offset between the two clocks. For example, if the transmitter-side clock has an offset of +100 PPM, and the receiver-side clock has an offset of −100 PPM, the offset between the two clocks will be 200 PPM.

In such asynchronous clocking systems, accurate recovery of data by the receiver system can involve accurate tracking of the frequency offset between the transmitter-side and receiver-side clocks, and adjustment of the local receiver-side clock, accordingly. Such systems can include a CDR that has frequency offset tracking capability, such as a frequency offset adaptation loop. For example, such CDRs can include first-order clock data recovery for handling jitter and/or certain other dynamic signal characteristics, and second-order clock data recovery for tracking and adapting to clock frequency offset.

In many asynchronous clocking systems, the frequency offsets are small. The small frequency offsets can typically be handled by traditional CDR techniques (e.g., by a second-order frequency offset adaptation loop). However, some asynchronous clocking systems allow for relatively large frequency offsets (e.g., the Peripheral Component Interconnect Express (PCIe) protocol allows for frequency offsets of up to 5000 PPM). With large frequency offsets, it can be challenging and/or impractical to design CDR frequency offset tracking loops with sufficiently large tracking ranges.

One traditional approach is to increase the bandwidth of the phase offset tracking loop (e.g., typically implemented as a first-order adaptation loop) of a CDR. Such approaches can be limited and expensive. An alternative traditional approach is to use higher precision clock generation components to reduce the frequency offset range, but higher precision components are typically more expensive and may not comply with other industrial specifications. Another traditional approach is to use trial-and-error during a link training phase (e.g., after the system is manufactured and prior to using the system operationally) to identify a correct offset and set the system, accordingly. Such approaches can often be slow and can involve special protocols or training procedures.

Embodiments described herein include a CDR frequency offset adaptation loop that generates an adaptation signal. The adaptation signal can be monitored to detect an adaptation error arising from an excessive frequency offset. An offset seed can be selected and injected into the frequency offset adaptation loop, thereby reinitializing the frequency offset adaptation loop with a less stressful seed. For example, injecting the offset seed can involve overriding an offset adaptation signal (e.g., stored in a register of a frequency accumulator block of a CDR) with the seed value.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1:
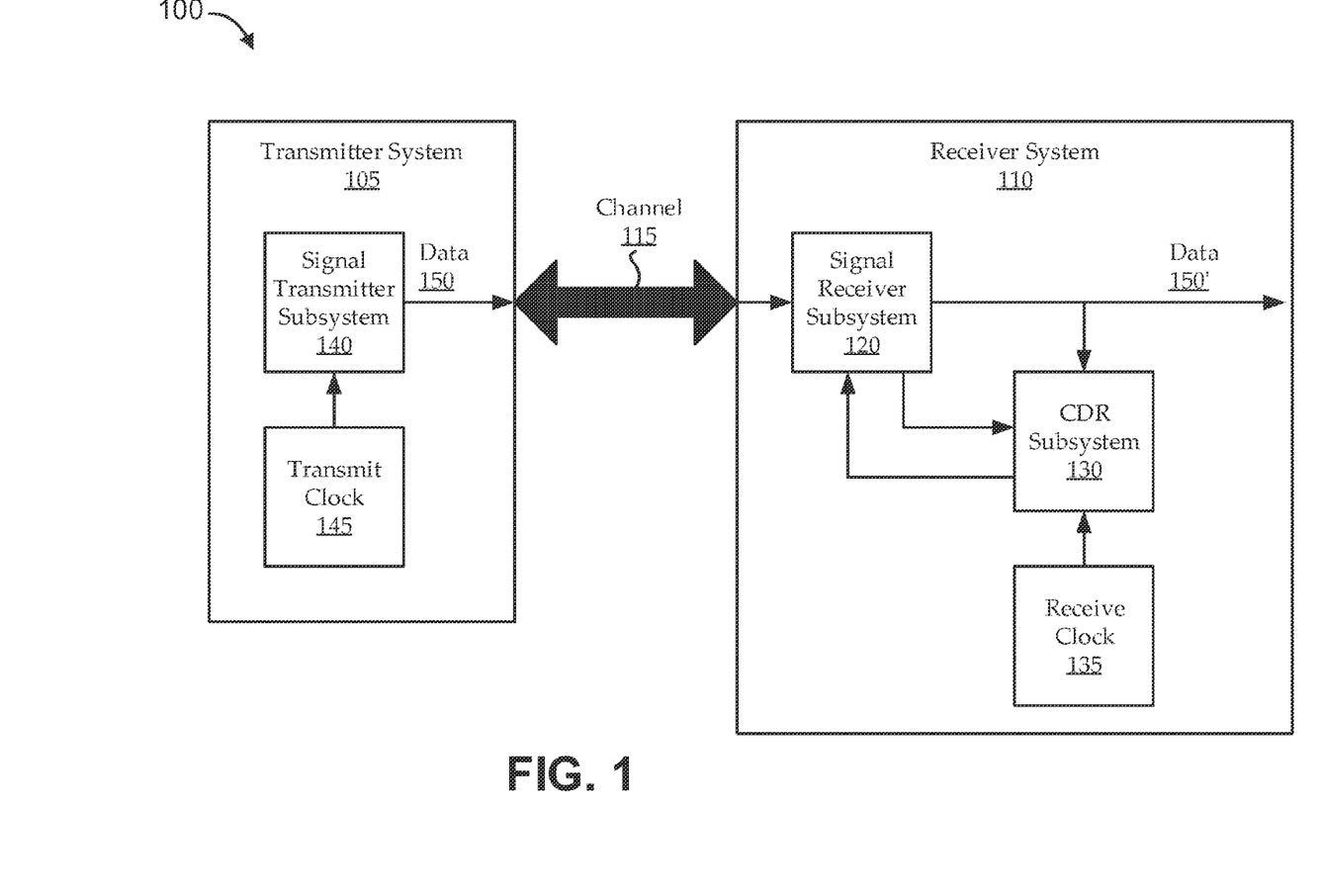
FIG. 1, a block diagram is shown of an illustrative communications environment, according to various embodiments.

Turning first to FIG. 1, a block diagram is shown of an illustrative communications environment 100, according to various embodiments. The communications environment 100 includes a transmitter system 105 and a receiver system 110 in communication via a data channel 115. The data channel 115 can be any parallel or serial, wired or wireless, or other suitable communications channel for carrying the data. The transmitter system 105 and/or receiver system 110 can be implemented in any suitable manner, for example as an integrated circuit that is part of and/or in communication with very-large-scale integration VLSI circuits, communication systems, storage area networks, local area networks, wide area networks, data centers, memory components, electronic devices, memory systems, and/or computer systems (such as multiple-core processor computer systems, computer systems that include components that communicate via capacitive proximity communication, computer systems that include components that communicate via optical proximity communication, etc.).

As illustrated, the transmitter system 105 can include a signal transmitter subsystem 140 that can have any suitable components, such as a driver, for communicating data over the data channel 115. The transmitter system 105 can also include a transmit clock subsystem 145. As illustrated, the receiver system 110 can include a signal receiver subsystem 120, a CDR subsystem 130, and a receive clock subsystem 135. While the receiver system 110 is illustrated as a simplified functional block diagram to avoid overcomplicating the description and figures, these simplifications should not be construed as limiting embodiments and implementations. The receiver system 110 can include fewer or additional components, and the various functional blocks can each be implemented as one or more discrete components, combined with other functional blocks into a single component, implemented in any suitable architecture or arrangement, etc. For example, the receiver system 110 includes any suitable components for receiving a data signal from the data channel 115 and reliably outputting data 150' as desired by other systems or components in communication with the receiver system 110.

The signal receiver subsystem 120 can include amplifiers, filters, analog-to-digital converters, parallel or serial interface components, and/or any other suitable components for converting the received data signal from the data channel 115 into a signal that can be used by other components of the receiver system 110. The signal receiver subsystem 120 can also include an equalizer, such as a decision feedback equalizer, a linear equalizer, a feed-forward equalizer, and/or any other suitable equalization component. Embodiments of the signal receiver subsystem 120 can seek to output recovered data 150' that corresponds to the data 150 sent over the data channel 115. The signal receiver subsystem 120 can also output other signals to be used by the CDR subsystem 130 to perform its functionality (e.g., edge and/or error signals).

The receive clock subsystem 135 generates a local clocking signal for the receiver system 100 using any suitable clocking components (e.g., a crystal oscillator, etc.). It is assumed herein that the receive clock subsystem 135 is separate from the transmit clock subsystem 145, so that there is asynchronous clocking on either side of the data channel. The receive clock subsystem 135 can pass its clocking signal to the CDR subsystem 130.

The CDR subsystem 130 can implement any suitable type of CDR technique. For example, some embodiments implement a so-called "baud rate." or "at-rate," CDR, such as a Muller-Mueller CDR, or the like; and such implementations can receive error signals from the signal receiver subsystem 120 for use, along with the clock signal from the receive clock subsystem 135 and the recovered data signal 150 from the signal receiver subsystem 120, in performing clock recovery. Other embodiments implement a so-called "Bang-Bang," or "oversampling," CDR; and such implementations can receive edge signals from the signal receiver subsystem 120 for use, along with the clock signal from the receive clock subsystem 135 and the recovered data signal 150 from the signal receiver subsystem 120, in performing clock recovery. For example, the signal receiver subsystem 120 can receive a signal over the data channel 115; amplify, filter, equalize, and/or otherwise process the signal; then shape (e.g., slice) the signal in an attempt to recover level transitions. Using the outputs of the signal receiver subsystem 120 and local clocking from the receive clock subsystem 135, the CDR subsystem 130 can attempt to recover (e.g., extract) embedded clock data corresponding to the transmitted data. This recovered clock data can be fed back to the signal receiver subsystem 120 for improving data recovery functionality (e.g., optimizing a sampling location, etc.). As described herein, such recovery can be frustrated at least by large relative clock frequency offsets in asynchronous clocking systems, and embodiments of the CDR subsystem 130 described herein can adapt to a wide range of such clock frequency offsets using novel frequency offset adaptation loop implementations.

Figure 2:
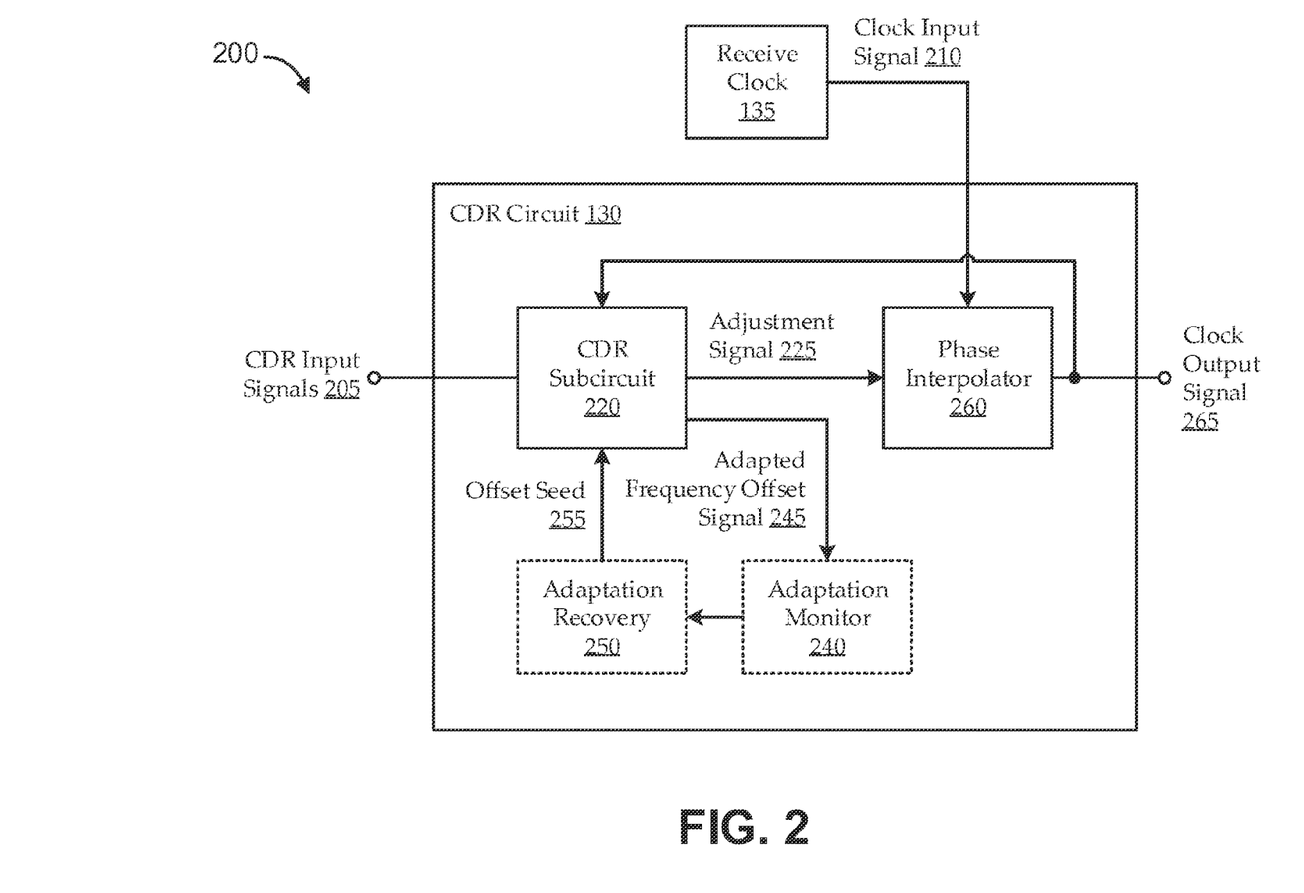
FIG. 2 shows an illustrative circuit block diagram for implementing embodiments of a clock data recovery (CDR) circuit, according to various embodiments.

FIG. 2 shows an illustrative circuit block diagram 200 for implementing embodiments of a CDR circuit 130, according to various embodiments. The CDR circuit 130 is intended as an implementation of the CDR subsystem 130 of FIG. 1, and it is shown in context of the receive clocking subsystem 135 of FIG. 1 for context. As illustrated, the CDR circuit 130 can include a number of sub-circuits, such as a CDR sub-circuit 220, a phase interpolator sub-circuit 260, an adaptation monitor sub-circuit 240, and an adaptation recovery sub-circuit 250. In some implementations, the adaptation monitor sub-circuit 240 and/or the adaptation recovery sub-circuit 250 are part of the CDR sub-circuit 220.

The various sub-circuits are shown as discrete functional blocks for the sake of clarity and should not be construed as limiting the scope of the invention. For example, each sub-circuit can include multiple functional blocks, multiple sub-circuits can be combined into a single functional block, functionality can be spread over and/or divided among multiple functional blocks, etc. Additionally, certain signals can be used by sub-circuits, even where not explicitly shown. For example, though not shown, the adaptation monitor sub-circuit 240 and/or the adaptation recovery sub-circuit 250 can be clocked by the clock output signal 265. Further, the functional blocks can include various hardware and/or software component(s) and/or module(s), including, but not limited to a circuit, an application specific integrated circuit (ASIC), or processor. The various illustrative logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The CDR sub-circuit 220 operates to calculate a frequency offset as a function of CDR input signals 205, and to generate an adaptation signal 225 according to the calculated frequency offset. The CDR input signals 205 can include any suitable output signals from the signal receiver subsystem 120 of FIG. 1, such as a recovered data signal, edge and/or error timing information, etc. The frequency offset refers herein to a relative frequency offset between a transmit-side clocking signal and a receive-side clocking signal. Each clocking signal is generated by clocking components designed to have a particular center frequency and having, in practice, some offset from that center frequency. For example, the frequency offset for a particular clock circuit may have a specified maximum, based on the quality of the clock generating components, manufacturing variances, etc. Because each of the transmit-side clocking circuit and the receive-side clocking circuit has a respective frequency offset, asynchronous clocking with those circuits on either side of a data channel can manifest a frequency offset that is effectively the sum of the respective transmit-side and receive-side frequency offsets. For example, if each of the transmit-side clocking circuit and the receive-side clocking circuit is designed to have a maximum respective frequency offset of ±250 PPM (parts per million bits), the total frequency offset across the data channel is effectively ±500 PPM.

In some implementations, the adaptation signal 225 is an "increment/decrement," or "advance/retard," signal, indicating that the local clocking signal (e.g., the sampling location, phase, etc.) should be shifted. As illustrated, the receive clock 135 can provide a clock input signal 210 to the phase interpolator sub-circuit 260. The phase interpolator sub-circuit 260 can use the clock input signal 210 and the adaptation signal 225 to generate a clock output signal 265, which can be an improved estimate of a recovered clock corresponding to the received data signal 205. The clock output signal 265 can be fed back to the CDR sub-circuit 220 to effectively adjust the phase of the local clocking signal (e.g., to correct for offset in clock input signal 210) to improve data recovery (e.g., to sample the data signal closer to the center of the data eye, increase link margin, or the like).

In asynchronous clocking environments, relatively small offsets in clocking frequencies can manifest as "beats" in the received signal. For example, a clock frequency recovered from the received data signal 205 and a clock frequency of the clock input signal 210 can move in and out of phase relative to each other at a rate that is a function of the difference between the frequencies. Accordingly, in some implementations, calculating the relative frequency offset can involve detecting such "beats."

When the frequency offset is not too large, the CDR sub-circuit 220 can adapt to the frequency offset using traditional techniques (e.g., a traditional frequency offset loop). As illustrated, embodiments include the adaptation monitor sub-circuit 240, which can monitor an adapted frequency offset signal 245 of the CDR sub-circuit 220 to detect adaptation failures. Such failures indicate that the frequency offset is too large, so that the CDR sub-circuit 220 is unable to adapt and is unable to properly perform its clock data recovery functions.

For example, as described above, the receive-side and transmit-side clock circuits are typically manufactured according to specifications, including a center frequency and maximum frequency offset, and the total maximum frequency offset of an asynchronous clocking system can be considered as the sum of the respective frequency offsets at either side of the data channel. In some embodiments, a frequency offset threshold can be set according to the total maximum frequency offset of the asynchronous clocking system. In some implementations, the threshold can be set to the total maximum frequency offset; and in other implementations, the threshold can be set to some margin outside the total maximum frequency offset. For example, if the total maximum frequency offset is ±500 PPM, the threshold may be set to ±600 PPM, or any other suitable value. If the adaptation signal 225 indicates (according to the adaptation monitor sub-circuit 240) that the CDR sub-circuit 220 is adapting to a PPM value outside the threshold, this can suggest an adaptation failure. For example, the CDR sub-circuit 220 can be designed to generate an adapted frequency offset signal 245 settled to values of up to ±650 PPM, so that values outside the threshold can be detected.

When the adaptation monitor sub-circuit 240 detects an adaptation failure (or detects an adapted frequency offset signal 245 suggestive of a probable adaptation failure), embodiments of the adaptation recovery circuit 250 can inject an offset seed 255 into the CDR sub-circuit 220. The offset seed 255 can be any suitable offset value that can effectively be loaded into the adaptation loop of the CDR sub-circuit 220 to reduce the adaptation stress. In some implementations, the adaptation recovery sub-circuit 250 has a set of offset seeds 255 stored in an integrated storage or in any suitable storage in communication with the adaptation recovery sub-circuit 250. For example, if the adaptation threshold is set to ±600 PPM, the offset seeds 255 can be −450 PPM, −150 PPM, +150 PPM, and +450 PPM. The adaptation recovery sub-circuit 250 can select one of the stored offset seeds 255 in any suitable manner. For example, an offset seed 255 can be selected at random, by round robin scheduling, by predicting an appropriate offset seed 255, etc. The adaptation recovery sub-circuit 250 can then inject the selected offset seed 255 into the CDR sub-circuit 220 in an attempt to recover from the adaptation failure, effectively reinitializing the frequency offset adaptation loop of the CDR circuit 130 according to the offset seed 255.

For the sake of illustration, the transmit and receive clocks are specified to have a maximum offset of ±900 PPM, the CDR sub-circuit 220 is designed to generate adapted frequency offset signals 245 that can settle to values of up to ±1000 PPM, and the adaptation threshold is set to ±925 PPM. The adaptation monitor sub-circuit 240 detects an adapted frequency offset signal 245 suggesting a frequency offset of close to +950 PPM. In response, the adaptation recovery sub-circuit 250 selects an offset seed 255 of −300 PPM, causing the CDR sub-circuit 220 to effectively re-initialize with that frequency offset value. In fact, the offset was +900 PPM, and the detected +950 PPM was the result of adaptation failure. On subsequent operational cycles, rather than attempting to adapt from a starting point of 0 PPM (i.e., adjusting to 900 PPM of offset), the CDR sub-circuit 220 can attempt to adapt from a starting point of −300 PPM (i.e., adjusting to 1200 PPM of offset, which is even farther outside the adaptation capability of the CDR sub-circuit 220). After some number of operational cycles, the CDR sub-circuit 220 has attempted to adapt under the even more stressful initial condition, and adaptation monitor sub-circuit 240 may continue to (e.g., or once again) detect an adaptation failure. This time, in response, the adaptation recovery sub-circuit 250 can select a different one of its offset seed 255 options, +300 PPM. This can cause the CDR sub-circuit 220 to effectively re-initialize with that frequency offset value, so that, on subsequent operational cycles, the CDR sub-circuit 220 can attempt to adapt from a starting point of +300 PPM. Accordingly, the actual frequency offset of +900 PPM is now only 600 PPM away from the adjusted baseline (i.e., 900−300=600), which is well within the adaptation capability of the CDR sub-circuit 220. After some number of operational cycles, the CDR sub-circuit 220 may now have properly adapted to the detected frequency offset. For example, the CDR sub-circuit 220 has now been able to adapt the local clocking signal to a frequency offset that corresponds to that of the transmit clock after being reinitialized to a less stressful initial condition. This can also permit the CDR circuit 130 to more effectively compensate for other clocking artifacts, and the like, such as jitter, etc.

Figure 3:
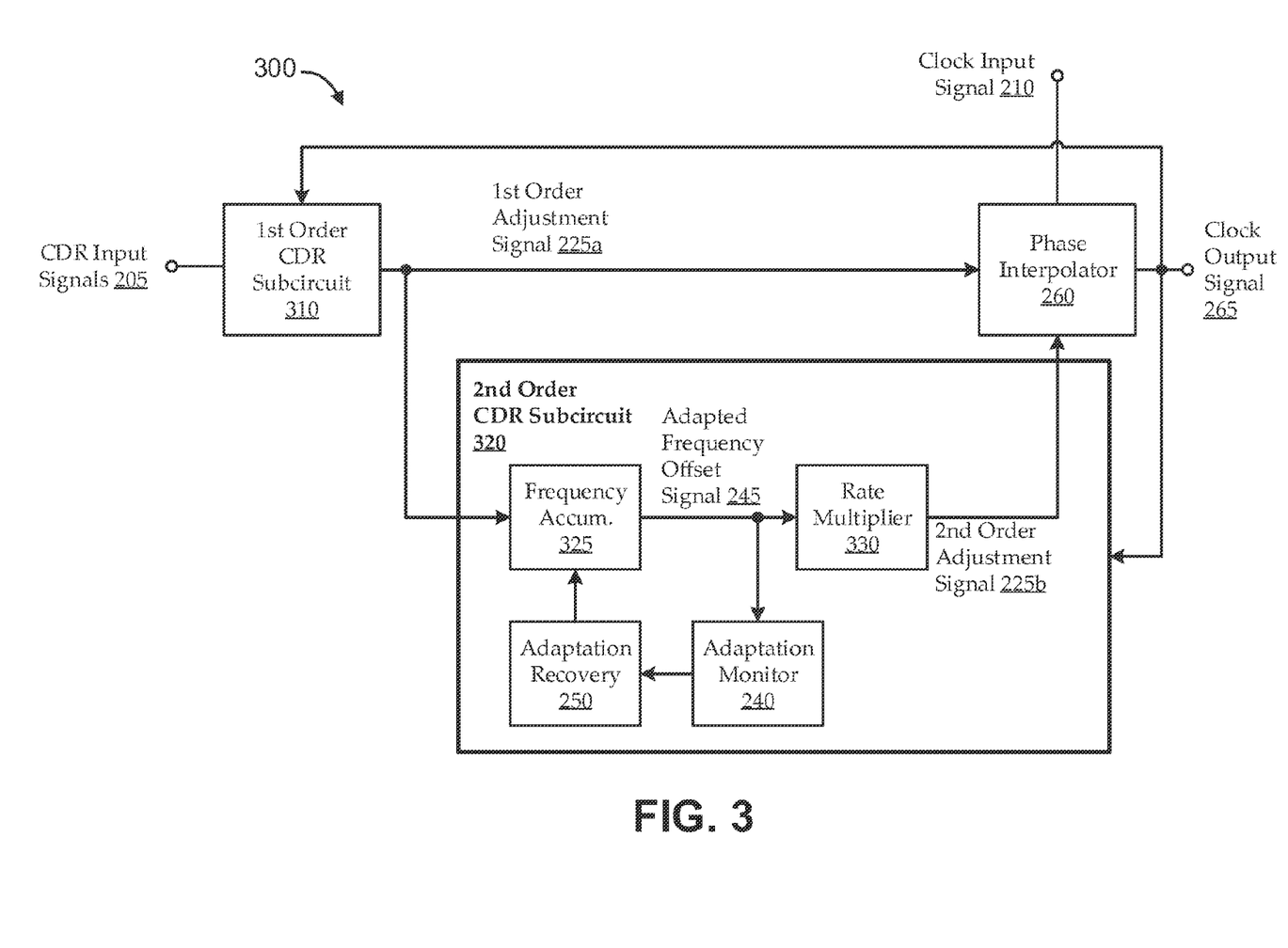
FIG. 3 shows an illustrative circuit block diagram for other CDR circuit implementations, according to various embodiments.

FIG. 3 shows an illustrative circuit block diagram 300 for other CDR circuit implementations, according to various embodiments. The circuit block diagram 300 can be an implementation of the CDR circuit 130 of FIG. 2 or of the CDR subsystem 130 of FIG. 1. As illustrated, the circuit block diagram 300 can include a number of sub-circuits, such as a first-order CDR sub-circuit 310, a second-order CDR sub-circuit 320, a phase interpolator sub-circuit 260, a frequency accumulator sub-circuit 325, a rate multiplier sub-circuit 330, an adaptation monitor sub-circuit 240, and an adaptation recovery sub-circuit 250.

The various sub-circuits are shown as discrete functional blocks for the sake of clarity and should not be construed as limiting the scope of the invention. For example, each sub-circuit can include multiple functional blocks, multiple sub-circuits can be combined into a single functional block, functionality can be spread over and/or divided among multiple functional blocks, etc. Further, the functional blocks can include various hardware and/or software component(s) and/or module(s), including, but not limited to a circuit, an application specific integrated circuit (ASIC), or processor. The various illustrative logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Embodiments of the first-order CDR sub-circuit 310 can generally perform phase adaptation functions. In some implementations, the first-order CDR sub-circuit 310 can attempt to shift the phase of a clock input signal 210 according to information extracted from CDR input signals 205 (e.g., a recovered data signal, edge and/or error timing information, etc.), for example, to optimize a data sampling location in the presence of jitter, inter-symbol interference, etc. Accordingly, the first-order CDR sub-circuit 310 can generate a first-order adaptation signal 225a. For example, the first-order adaptation signal 225a can instruct the phase interpolator sub-circuit 260 to shift the phase of the clock input signal 210 (i.e., the receive clock signal) by some number of units (e.g., as an "increment/decrement" or "advance/retard" signal), thereby generating a clock output signal 265. The clock output signal 265 can be fed back to the first-order CDR sub-circuit 310 and the second-order CDR sub-circuit 320 to effectively adjust the local clocking signal.

Embodiments of the second-order CDR sub-circuit 320 can perform frequency offset adaptation. As described above, presence of frequency offset in an asynchronous clocking system can manifest as a periodic pattern (e.g., of increments and decrements) in the first-order adaptation signal 225a (i.e., as beats). Such a pattern can be detected by accumulating the first-order adaptation signal 225a over time. Some embodiments of the second-order CDR sub-circuit 320 include a frequency accumulator sub-circuit 325 that accumulates the first-order adaptation signal 225a over time. For example, the frequency accumulator sub-circuit 325 can include a shift register or other suitable memory or device for accumulating enough samples of the first-order adaptation signal 225a to be able to discern a pattern that indicates a frequency offset. The amount of accumulation (e.g., the number of register locations) can be designed to generate an adapted frequency offset signal 245 that can settle to values ranging beyond an adaptation threshold. The detected pattern can be used by a rate multiplier sub-circuit 330 of the second-order CDR sub-circuit 320 to generate a second-order adaptation signal 225b. For example, the second-order adaptation signal 225b can be an implementation of the adaptation signal 225 described above with respect to FIG. 2 for causing the phase interpolator sub-circuit 260 to effectively adjust the frequency of the clock input signal 210 to account for frequency offset.

As described above, a traditional type of frequency offset adaptation can be used when the frequency offset is not too large. However, in the presence of large frequency offsets, such traditional adaptation approaches can fail. Accordingly, the second-order CDR sub-circuit 320 can improve the range of frequency offsets over which it can effectively adapt by using a novel type of frequency offset adaptation loop. As illustrated, and as described above, the novel frequency offset adaptation loop can include the adaptation monitor sub-circuit 240 for monitoring the adapted frequency offset signal 245 to detect adaptation failures, and the adaptation recovery circuit 250 for injecting an offset seed into the frequency offset adaptation loop (i.e., of the second-order CDR sub-circuit 320). In some implementations, the offset seed is injected into the frequency accumulator sub-circuit 325 to force a particular second-order adaptation signal 225b in response. For example, the frequency accumulator sub-circuit 325 can be re-initialized (e.g., its memory can be overwritten), according to the offset seed.

Figure 4:
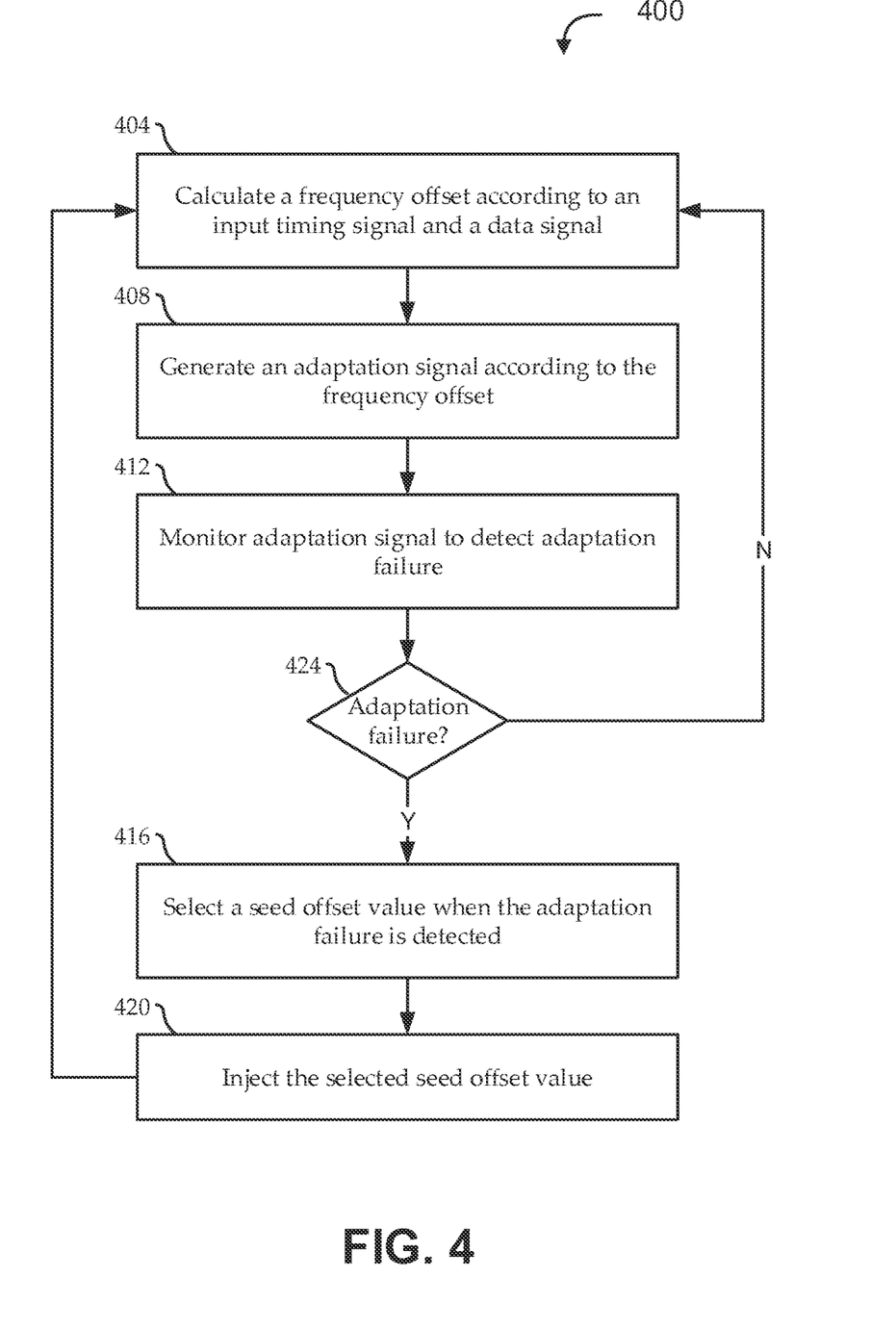
FIG. 4 shows a flow diagram of an illustrative method for clock data recovery with increased frequency offset tracking, according to various embodiments.

FIG. 4 shows a flow diagram of an illustrative method 400 for clock data recovery with increased frequency offset tracking, according to various embodiments. Embodiments of the method 400 begin at stage 404 by calculating a frequency offset (e.g., in a clock-data recovery (CDR) frequency offset adaptation loop) as a function of a received data signal and an input timing signal. The input timing system can include edge samples (e.g., for Bang-Bang, or oversampling, CDRs) and/or error samples (e.g., for MM, or at-rate, CDRs). At stage 408, embodiments can generate an adaptation signal according to the frequency offset. For example, the adaptation signal can be an adapted frequency offset signal that indicates an adaptation (e.g., to a phase interpolator, or the like) to correct for the calculated frequency offset.

At stage 412, the adaptation signal can be monitored to detect an adaptation failure. For example, detecting the adaptation failure can include detecting that the frequency offset is outside of a predetermined adaptable range (e.g., a range within which the CDR frequency offset adaptation loop should be able to track). As described above, the adaptation failure can, in some implementations, be detected as a particular signature present in the adaptation signal.

At stage 424, a determination can be made as to whether an adaptation failure is detected. If no adaptation failure is detected, the method 400 can cycle through stages 404-412. For example, calculating, generating, and monitoring of stages 404-412 can effectively run in the background whenever its greater context (e.g., the communications environment in which it is implemented) is running.

In response to detecting the adaptation failure (i.e., if the determination at stage 424 is that an adaptation failure is detected), one of a predetermined set of offset seeds can be selected at stage 416. For example, a number of candidate offset seeds can be pre-stored, and the values of the offset seeds can be selected to span the range of adaptable frequency offsets (e.g., distributed evenly across the range). Some embodiments can inject the selected offset seed into the frequency offset adaptation loop at stage 420, in response to the adaptation monitor circuit detecting the adaptation failure. The method 400 can continue to attempt its tracking of the frequency offset in context of the injected offset seed, for example, by returning to stage 404. In some instances, the selected offset seed can fail to reduce the adaptation stress of the frequency offset adaptation loop (or even further frustrate the frequency offset tracking), so that the adaptation failure continues after the injection. In such cases, when the method 400 returns to stage 416, a different offset seed can be selected, and the new offset seed can be injected at stage 420. Any suitable number of offset seeds can be selected iteratively in any suitable manner (e.g., by round robin scheduling, randomly, etc.) until frequency offset adaptation can be achieved.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A system for clock data recovery comprising:
    a clock data recovery (CDR) circuit that operates to calculate a frequency offset as a function of a received data signal and an input timing signal, and to generate an adaptation signal according to the frequency offset;
    an adaptation monitor circuit that operates to monitor the adaptation signal to detect an adaptation failure; and
    an adaptation recovery circuit that operates to inject an offset seed into the CDR circuit in response to the adaptation monitor circuit detecting the adaptation failure.

2. The system of claim 1, further comprising:
    a receiver system coupled with a data channel and comprising the CDR circuit and a receiver-side clock generation circuit, wherein:
        the received data signal is received from a transmitter system via the data channel, the transmitter system comprising a transmitter-side clock generation circuit that generates a transmit clocking signal;
        the local clocking signal is generated by the receiver-side clock generation circuit; and
        the frequency offset is an offset between a frequency of the transmit clocking signal and a frequency of the local clocking signal.

3. The system of claim 1, wherein:
    the CDR comprises a frequency offset adaptation loop that operates to generate the adaptation signal according to the frequency offset; and
    the adaptation recovery circuit injecting the offset seed into the CDR circuit reinitializes the frequency offset adaptation loop according to the offset seed.

4. The system of claim 1, wherein the adaptation signal is a second adaptation signal, and the CDR comprises:
    a first-order CDR circuit that generates a first adaptation signal as a function of the received data signal and the input timing signal; and
    a second-order CDR circuit that generates the second adaptation signal as a function of the first adaptation signal by calculating the frequency offset according to a pattern detected in the first adaptation signal.

5. The system of claim 1, wherein:
    the CDR circuit is designed to operate in an asynchronous clocking system having a nominal frequency offset range; and
    the adaptation monitor circuit operates to detect the adaptation failure when the calculated frequency offset is outside an adaptable frequency offset range predetermined according to the nominal frequency offset range.

6. The system of claim 1, wherein the adaptation recovery circuit selects the offset seed from a set of offset seeds stored in communication with the adaptation recovery circuit.

7. The system of claim 1, wherein the adaptation signal is an advance/retard signal.

8. The system of claim 1, further comprising:
a phase interpolator circuit that is coupled with the CDR circuit and operates to generate an adapted clock signal from the adaptation signal.

9. The system of claim 1, wherein the CDR is a baud rate CDR.

10. The system of claim 1, further comprising:
an integrated circuit having the CDR circuit, the adaptation monitor circuit, and the adaptation recovery circuit integrated thereon.

11. The system of claim 4, wherein the second-order CDR circuit comprises:
a frequency accumulator that accumulates the pattern indicating the frequency offset,
wherein the adaptation recovery circuit operates to inject the offset seed into the frequency accumulator in response to the adaptation monitor circuit detecting the adaptation failure.

12. The system of claim 6, wherein the adaptation recovery circuit uses round robin scheduling to select the offset seed.

13. A method for clock data recovery comprising:
calculating a frequency off et in a clock-data recovery (CDR) frequency offset adaptation loop as a function of a received data signal and an input timing signal;
generating an adaptation signal according to the frequency offset;
monitoring the adaptation signal to detect an adaptation failure;
selecting one of a predetermined set of offset seeds; and
injecting the selected offset seed into the frequency offset adaptation loop in response to the adaptation monitor circuit detecting the adaptation failure.

14. The method of claim 13, further comprising:
detecting continued adaptation failure subsequent to the injecting;
selecting another of the predetermined set of offset seeds in response to the detected continued adaptation failure; and
injecting the selected other offset seed into the frequency offset adaptation loop in response to the detected continued adaptation failure.

15. The method of claim 13, further comprising:
re-initializing the frequency offset adaptation loop according to the selected offset seed coincident with the injecting.

16. The method of claim 13, further comprising:
receiving the received data signal by a receiver system from a transmitter system via a data channel; and
receiving the local clocking signal from a clock generator of the receiver system,
wherein the frequency offset is an offset between a frequency of a transmit clocking signal generated at the transmitter system and a frequency of the local clocking signal.

17. The method of claim 13, wherein the adaptation signal is a second adaptation signal, and further comprising:
generating a first adaptation signal by a first-order CDR circuit as a function of the received data signal and the local clocking signal; and
generating the second adaptation signal by a second-order CDR circuit as a function of the first adaptation signal by calculating the frequency offset according to a pattern detected in the first adaptation signal.

18. The method of claim 13, further comprising:
setting an adaptable frequency offset range according to a nominal frequency offset range of a target asynchronous clocking system,
wherein detecting the adaptation failure comprises detecting when the calculated frequency offset is outside the adaptable frequency offset range.

19. The method of claim 13, wherein the offset seed is selected according to round robin scheduling.

20. A receiver system in asynchronous communication with a transmitter system over a data channel, the receiver system comprising:
a first-order clock data recovery (CDR) subsystem that generates a first adaptation signal as a function of a data signal received over the data channel and an input timing signal; and
a second-order CDR system that generates a second adaptation signal as a function of the first adaptation signal by calculating a frequency offset according to a pattern detected in the first adaptation signal, the calculated frequency offset corresponding to an offset between a frequency of a transmit clocking signal generated at the transmitter system and a frequency of the local clocking signal,
the second-order CDR system comprising a frequency offset adaptation loop that monitors the second adaptation signal to detect an adaptation failure resulting from the frequency offset being outside an adaptable range of the second-order CDR system, and injects an offset seed into the frequency offset adaptation loop in response to detecting the adaptation failure.

* * * * *